(12) United States Patent
Goto et al.

(10) Patent No.: US 12,219,739 B2
(45) Date of Patent: Feb. 4, 2025

(54) ELEMENT-MOUNTED BOARD AND METHOD FOR MANUFACTURING ELEMENT-MOUNTED BOARD

(71) Applicant: DENKA COMPANY LIMITED, Tokyo (JP)

(72) Inventors: Daisuke Goto, Tokyo (JP); Hiroaki Ota, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 175 days.

(21) Appl. No.: 17/911,890

(22) PCT Filed: Mar. 11, 2021

(86) PCT No.: PCT/JP2021/009761
§ 371 (c)(1),
(2) Date: Sep. 15, 2022

(87) PCT Pub. No.: WO2021/200011
PCT Pub. Date: Oct. 7, 2021

(65) Prior Publication Data
US 2023/0156966 A1  May 18, 2023

(30) Foreign Application Priority Data
Mar. 31, 2020  (JP) .................... 2020-063126

(51) Int. Cl.
*H05K 7/20* (2006.01)
(52) U.S. Cl.
CPC .................. *H05K 7/2039* (2013.01)

(58) Field of Classification Search
CPC ............. H05K 7/2039; H05K 7/20418; H05K 7/20472; H05K 7/20481
See application file for complete search history.

(56) References Cited

U.S. PATENT DOCUMENTS

| | | |
|---|---|---|
| 6,447,894 B1 | 9/2002 | Hirotsuru et al. |
| 10,636,723 B2 | 4/2020 | Goto et al. |
| 10,640,853 B2 | 5/2020 | Ishihara et al. |
| 11,296,008 B2 | 4/2022 | Miyakawa et al. |
| 2017/0162469 A1 | 6/2017 | Kino et al. |

(Continued)

FOREIGN PATENT DOCUMENTS

| | | |
|---|---|---|
| JP | 3468358 B2 | 11/2003 |
| JP | 2006-117491 A | 5/2006 |

(Continued)

OTHER PUBLICATIONS

May 18, 2021 International Search Report issued in International Patent Application No. PCT/JP2021/009761.

*Primary Examiner* — Adrian S Wilson
(74) *Attorney, Agent, or Firm* — Oliff PLC

(57) ABSTRACT

An element-mounted board includes a heat-dissipating plate in which aluminum or magnesium-containing metal layers are formed on both front and back surfaces of a flat plate-shaped metal-silicon carbide complex including aluminum or magnesium, and an electronic element including a ceramic plate, which is mounted on one surface side of the heat-dissipating plate, in which a flatness of the other surface of the heat-dissipating plate is 600 μm or less.

6 Claims, 3 Drawing Sheets

(56) References Cited

U.S. PATENT DOCUMENTS

| | | | |
|---|---|---|---|
| 2017/0236767 A1* | 8/2017 | Miyakawa | C22C 21/04 428/602 |
| 2017/0317007 A1* | 11/2017 | Goto | C22F 1/04 |
| 2019/0093201 A1 | 3/2019 | Ishihara et al. | |
| 2020/0335415 A1 | 10/2020 | Goto et al. | |

FOREIGN PATENT DOCUMENTS

| | | |
|---|---|---|
| WO | 2015/115649 A1 | 8/2015 |
| WO | 2016/017689 A1 | 2/2016 |
| WO | 2016/021645 A1 | 2/2016 |
| WO | 2017/158993 A1 | 9/2017 |

* cited by examiner

ELEMENT-MOUNTED BOARD AND METHOD FOR MANUFACTURING ELEMENT-MOUNTED BOARD

TECHNICAL FIELD

The present invention relates to an element-mounted board and a method for manufacturing an element-mounted board. More specifically, the present invention relates to an element-mounted board on which an electronic element including a ceramic plate is mounted on at least one surface of a specific heat-dissipating plate.

BACKGROUND ART

In recent years, heat-dissipating plates formed of metal-silicon carbide complexes have come to be used as heat-dissipating components for power modules in electric vehicle and electric railway applications, replacing the copper of the related art.

As the metal for metal-silicon carbide complexes, aluminum and alloys thereof are often used.

As the manner of using heat-dissipating plates, electronic elements including power semiconductor elements and the like are usually mounted on one surface side of the heat-dissipating plate. In addition, the other surface side of the heat-dissipating plate is often bonded to other heat-dissipating components such as heat-dissipating fins or heat-dissipating units in order to improve the heat dissipation property for heat generated from the electronic elements.

In order to obtain a good heat dissipation performance, it is important that the heat-dissipating plate and other heat-dissipating components are bonded with as little space therebetween as possible. For this reason, the properties of the other surface side (the side opposite to the surface on which the electronic elements are mounted) of the heat-dissipating plate are important.

For example, in a case of bonding a heat-dissipating plate to other heat-dissipating components, the heat-dissipating plate is generally fixed with screws to other heat-dissipating components using holes provided on the outer peripheral portion of the heat-dissipating plate. However, when the "other surface" of the heat-dissipating plate is a concave surface or when there are a large number of fine irregularities present on the "other surface", gaps occur between the heat-dissipating plate and the other heat-dissipating components, resulting in decreased thermal conductivity.

In order to avoid the problems described above, a heat-dissipating plate was proposed in which a surface that is bonded to other heat-dissipating components is curved in a slightly convex manner, such that as few gaps as possible are created between the heat-dissipating plate and other heat-dissipating components.

This is because, as described above, as heat-dissipating plates are usually used after being fixed to other heat-dissipating components with fixing members such as screws, the bonding surface with other heat-dissipating components being slightly curved in a convex manner makes the bonding surface "moderately flat" when fixed with a fixing member and increases the bonding property (adhesion) with the other heat-dissipating components.

As an example, Patent Document 1 describes a silicon carbide complex which is a plate-shaped complex formed by impregnating a metal of which the main component is aluminum in a porous silicon carbide molded body, which has, in the surface of the plate-shaped complex, four or more holes for screw-fastening to other heat-dissipating components facing the convex surface of the plate-shaped complex, and in which a relationship between warpage (Cx; µm) with respect to a 10 cm length in the direction between the holes (X direction) and warpage (Cy; µm) with respect to a 10 cm length in the direction (Y direction) perpendicular thereto is 50≤Cx≤250 and −50≤Cy≤200 (excluding Cy=0).

As another example, Patent Document 2 describes a silicon carbide complex which is a plate-shaped complex formed by impregnating a metal of which the main component is aluminum in a porous silicon carbide molded body, having warping in which warpage with respect to a 10 cm length of the main surface of the complex is 250 µm or less.

[Patent Document 1] Japanese Patent No. 3468358
[Patent Document 2] PCT International Publication No. WO2015/115649

SUMMARY OF THE INVENTION

Technical Problem

As described above, it is known that by (1) first manufacturing a slightly curved heat-dissipating plate, and (2) when bonding the above to other heat-dissipating components, "flattening" the curve by the force of fixing members such as screws, the bonding property between the heat-dissipating plate and other heat-dissipating components is improved and the heat dissipation property is improved.

However, the curved heat-dissipating plates described in Patent Documents 1, 2, and the like have specific values for the amount of curvature and the like only for the heat-dissipating plate.

As described above, usually, a heat-dissipating plate has an electronic element mounted on one surface side and other heat-dissipating components bonded to the other surface side. In a case where a heat-dissipating plate is used in such a manner, if the degree of curvature is optimized for only the heat-dissipating plate, there is a possibility that (due to the influence of the electronic element being mounted thereon) the degree of curvature may not be optimal when actually mounted on an electronic device.

In addition, as the electronic element (typically a power element) mounted on one surface side of the heat-dissipating plate usually includes a ceramic material such as a ceramic plate, there is also a possibility that, due to the difference between the magnitude of thermal expansion of this ceramic material and the magnitude of thermal expansion of the heat-dissipating plate, unintended curvature and undesired stresses may be generated.

In particular, in recent years, in power modules, there is a demand for greater improvement of the heat dissipation property. Therefore, in order to achieve an optimal heat dissipation performance, investigation into improving the heat dissipation property by integrally forming electronic elements, heat-dissipating plates, and other heat-dissipating members may be considered.

However, as described above, past investigation has been limited to optimization of the amount of curvature or the like for only the heat-dissipating plate. To the present inventors' knowledge, so far, investigation into improving the heat dissipation property by integrally forming the electronic element, heat-dissipating plate, and other heat-dissipating members has been insufficient.

In light of the circumstances described above, the present inventors carried out an investigation with the object of obtaining an electronic device with a favorable heat dissipation property from an integrated viewpoint including not only the heat-dissipating plate alone, but also the electronic elements and the like mounted thereon.

Solution to Problem

As a result of intensive investigation, the present inventors completed the invention provided below and solved the problems described above.

According to the present invention, there is provided an element-mounted board including a heat-dissipating plate in which aluminum or magnesium-containing metal layers are formed on both front and back surfaces of a flat plate-shaped metal-silicon carbide complex including aluminum or magnesium, and an electronic element including a ceramic plate, which is mounted on one surface side of the heat-dissipating plate, in which a flatness of the other surface of the heat-dissipating plate is 600 μm or less.

In addition, according to the present invention, there is provided a method for manufacturing the element-mounted board described above, the method including a preparing step of preparing a heat-dissipating plate in which an aluminum or magnesium-containing metal layer is formed on both front and back surfaces of a flat plate-shaped metal-silicon carbide complex including aluminum or magnesium, a flatness adjusting step of adjusting a flatness of at least one surface of the heat-dissipating plate, and a mounting step of mounting an electronic element including a ceramic plate on a surface on the opposite side to the surface of the heat-dissipating plate.

Advantageous Effects of Invention

According to the present invention, it is possible to obtain an element-mounted board (electronic device) with a favorable heat dissipation property.

DESCRIPTION OF EMBODIMENTS

Figure 1:
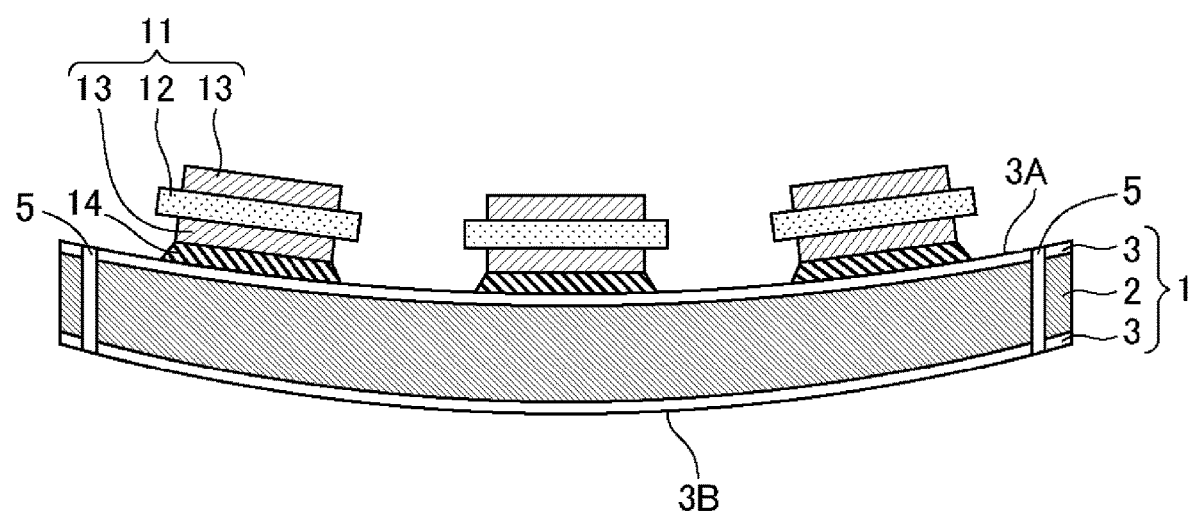
FIG. 1 is a diagram (cross-sectional view) schematically representing an example of an element-mounted board.

A detailed description will be given below of embodiments of the present invention, with reference to the drawings.

In all drawings, similar constituent components will be marked with similar reference numerals and explanation thereof will not be repeated as appropriate.

Figure 2:
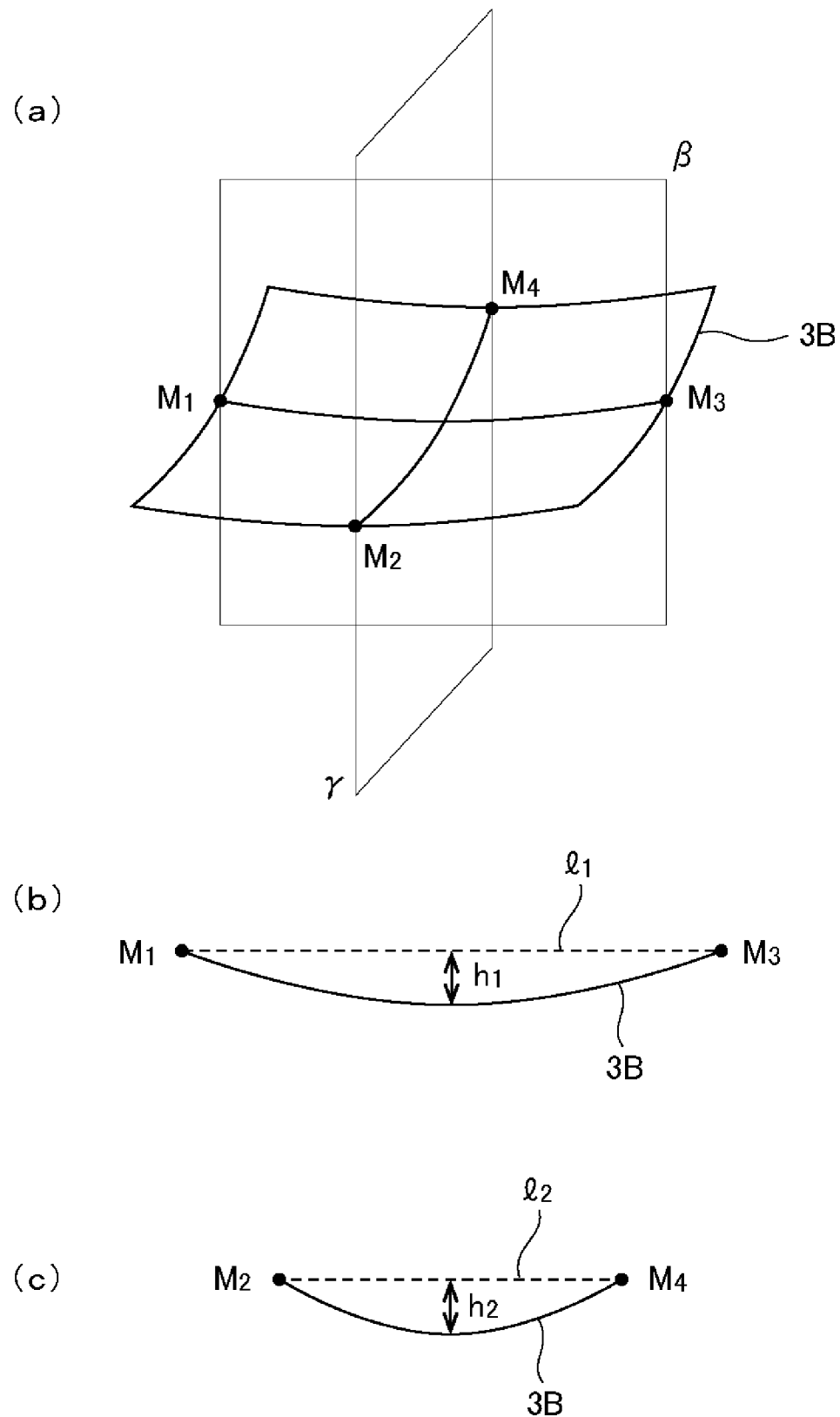
FIG. 2 is a diagram for illustrating the form of a main surface 3B.

In order to avoid complication, (i) in a case where there are a plurality of identical constituent components in the same drawing, only one may be marked with a reference numeral and not all may be marked with a reference numeral, or (ii) in particular, in FIG. 2 and thereafter, constituent components similar to in FIG. 1 may not be marked with a reference numeral again.

All drawings are for illustration only. The shapes, dimensional ratios, and the like of each member in the drawings do not necessarily correspond to the actual articles. In particular, the shapes and dimensional ratios may be exaggeratedly drawn for the sake of clarity in the explanation. In particular, the size of the "curvature" is exaggerated in each diagram compared to the actual article.

Unless otherwise expressly stated, in the present specification, the term "substantially", unless otherwise expressly stated, represents including a range taking into consideration manufacturing tolerances, assembly variations, and the like.

Unless otherwise noted, it is possible to adopt values at room temperature (25° C.) for various numerical values (in particular, measured values) in the present specification that may vary depending on the temperature.

<Element-Mounted Board>

FIG. 1 is a diagram (cross-sectional view) schematically representing an example of an element-mounted board of the present embodiment.

The element-mounted board of FIG. 1 is provided with a heat-dissipating plate 1 and electronic elements 11 mounted on one surface side of the heat-dissipating plate 1.

In the heat-dissipating plate 1, aluminum or magnesium-containing metal layers 3 (also referred to below as the metal layer 3) are formed on the front and back surfaces of a flat plate-shaped metal-silicon carbide complex 2 (also referred to below as the complex 2) including aluminum or magnesium.

For the two main surfaces of the heat-dissipating plate 1, the surface on the side on which the electronic elements 11 are mounted is a main surface 3A and the other surface is a main surface 3B.

For example, the heat-dissipating plate 1 has a plurality of through holes 5 in the outer peripheral portion thereof. More specifically, as described below, in a case where the heat-dissipating plate 1 is substantially rectangular, the through holes 5 are preferably provided at least at the four corners of the heat-dissipating plate 1.

The through holes 5 are used when bonding the heat-dissipating plate 1 to other heat-dissipating components (for example, heat-dissipating fins, and the like) with screws or the like.

The electronic element 11 includes at least a ceramic plate 12. In FIG. 1, the electronic element 11 has a structure in which the ceramic plate 12 is interposed between two metal layers 13.

The electronic element 11 is mounted on the main surface 3A side of the heat-dissipating plate 1 by, for example, soldering with solder 14. When the electronic element 11 is viewed from the top surface with the main surface 3A of the heat-dissipating plate 1 as the top surface, 10% to 80% of the area of the heat-dissipating plate 1 is covered by the electronic element 11.

In the element-mounted board of FIG. 1, the flatness of the main surface 3B (that is, the surface on the opposite side to the surface on which the electronic elements 11 are mounted) is 50 μm to 600 μm, preferably 100 μm to 500 μm, and more preferably 150 μm to 450 μm.

It is considered that, in a state where the electronic element 11 is mounted and not just the heat-dissipating plate 1 alone, the flatness of the main surface 3B being in the range described above makes the heat dissipation property "as a whole" of the element-mounted board and other heat-dissipating members favorable.

That is, it is considered that, when the electronic element 11 is mounted on the heat-dissipating plate 1 to form an element-mounted board, the flatness of the main surface 3B being an appropriate numerical value makes the bonding property between the main surface 3B and other heat-dissipating members favorable when the element-mounted board is bonded with other heat-dissipating members and makes it possible to obtain an excellent heat dissipation performance.

Flatness is defined as the distance between two parallel planes in a case where the distance between the two parallel planes is the smallest when a flat shape is interposed between two geometrically parallel planes (refer to JIS B 0621).

An example of a flatness measuring apparatus is the VR-3000 apparatus manufactured by Keyence Corporation.

Description will be continued of preferable forms of the element-mounted board of the present embodiment.

[Properties of Heat-Dissipating Plate 1]

The main surface 3B (the surface of the heat-dissipating plate 1 on the opposite side to the surface on which the electronic element 11 is mounted) is preferably curved to be convex in the direction of the opposite side to the main surface 3A. Due to this, when the heat-dissipating plate 1 is fixed to other heat-dissipating members (heat-dissipating fins, and the like) with fixing members such as screws, it is possible to easily make the bonding surface "flat" and to further improve the bonding property (adhesion) between the heat-dissipating plate 1 and the heat-dissipating fins and the like.

The heat-dissipating plate 1 is preferably substantially rectangular. In other words, when the heat-dissipating plate 1 is viewed from the top surface with one of the main surfaces of the heat-dissipating plate 1 as the top surface, the shape of the heat-dissipating plate 1 is substantially rectangular.

Here, "substantially rectangular" means that at least one of the four corners of the heat-dissipating plate 1 may be processed into a rounded shape instead of a right-angled shape (naturally, the four corners may be right-angled shapes).

In a case where at least one of the four corners of the heat-dissipating plate 1 is processed into a rounded shape, it is possible to define the point where the straight portions of the short sides and long sides of the heat-dissipating plate 1 intersect when extended as the "vertices" of the rectangle, when viewed from the top surface. In addition, at this time, it is possible to define the "length of the short side" or "length of the long side" of the heat-dissipating plate 1 with the "vertices" described above as the starting points or ending points.

In a case where the heat-dissipating plate 1 is substantially rectangular, the vertical and horizontal lengths of the heat-dissipating plate 1 are from 40 mm×90 mm to 250 mm×140 mm approximately, as an example.

The thickness of the heat-dissipating plate 1 is 2 mm or more and 6 mm or less and preferably 3 mm or more and 5 mm or less as an example. In a case where the thickness of the heat-dissipating plate 1 is not uniform, at least the thickness at the center of gravity portion of the heat-dissipating plate 1 is preferably in the range described above.

The thickness of the metal layer 3 is, for example, approximately 50 μm to 300 μm for the top and bottom together.

In addition to the flatness of the overall main surface 3B being in the numerical range described above, it is possible to further improve the heat dissipation performance by designing the curvature of the main surface 3B to be finer.

In this regard, for example, a case where the heat-dissipating plate 1 is substantially rectangular, the length of the long side of the rectangle is a and the length of the short side is b, and the main surface 3B is curved to be convex in the direction of the opposite side to the main surface 3A may be considered.

FIG. 2(a) is a diagram for illustrating the form of the main surface 3B. To paraphrase, the diagram clearly shows only the main surface 3B of the heat-dissipating plate 1 in the element-mounted board of the present embodiment.

In addition, FIG. 2(b) is a cross-sectional view when the main surface 3B is cut at the cross-section β in FIG. 2(a), while FIG. 2(c) is a cross-sectional view when the main surface 3B is cut at the cross-section γ in FIG. 2(a).

In these diagrams, auxiliary lines and the like are added for illustration.

Here, the straight line connecting the midpoints of the two short sides of the main surface 3B (shown by $M_1$ and $M_3$ in the diagram) is denoted by $l_1$, while the straight line connecting the midpoints of the two long sides of the main surface 3B (shown by $M_2$ and $M_4$ in the diagram) is denoted by $l_2$.

In addition, when the main surface 3B is cut in a cross-section β that includes $l_1$ and is substantially orthogonal to the main surface 3B, the maximum distance between a point on the curve formed by the main surface 3B and $l_1$ in the cross-section is denoted by $h_1$. Furthermore, when the main surface 3B is cut in a cross-section γ including $l_2$ and substantially orthogonal to the main surface 3B, the maximum distance between the point on the curve formed by the main surface 3B and $l_2$ in the cross-section is denoted by $h_2$.

At this time, it is preferable to design the element-mounted board such that $h_1/a > h_2/b$.

More specifically, the value of $(h_1/a)/(h_2/b)$ is preferably 1.0 or more and 1.9 or less and more preferably 1.07 or more and 1.6 or less.

It is possible to interpret the inequality described above as follows.

$h_1/a$ means "curvature per unit length in the long side direction" in the heat-dissipating plate 1.

Similarly, $h_2/b$ means "curvature per unit length in the short side direction" in the heat-dissipating plate 1.

In this manner, it is possible to interpret "$h_1/a > h_2/b$" as meaning that the "degree of curvature" in the long side direction is greater than that in the short side direction, even when excluding the long side being longer than the short side.

When the heat-dissipating plate 1 on which the electronic element 11 is mounted is pressed against and bonded to another component using screws or the like, the rectangular shape (oblong shape) of the heat-dissipating plate 1 is more easily deformed (easily bent) in the long side direction than in the short side direction. Thus, by making the "degree of curvature" in the long side direction larger than that in the short side direction, it is considered that it is possible to bond the heat-dissipating plate 1 more snugly when bonding to other heat-dissipating components and to obtain an effect of further improving the heat dissipation property, improving the reliability, and the like.

An arithmetic mean roughness Ra (referred to below as "surface roughness Ra") of the portion in the main surface 3A of the heat-dissipating plate 1 on which the electronic element 11 is not mounted (the portion where the main surface 3A is exposed) is preferably 0.2 μm to 2.0 μm and more preferably 0.5 μm to 1.6 μm.

As described above, the electronic element 11 is mounted on the heat-dissipating plate 1 by soldering, for example, with the solder 14. It is considered that the value of the surface roughness Ra being appropriate increases the wettability of the solder and, as a result, it is possible to improve the bonding strength between the heat-dissipating plate 1 and the electronic element 11.

In addition, although the details are unknown, it is considered that the roughness (surface roughness Ra) of the main surface 3A being appropriate creates a kind of "play" between the heat-dissipating plate 1 and the electronic element 11. Due to this, it is also considered that the deterioration of the bonding property is suppressed even in the presence of external forces, heat cycles, distortion when connecting the element-mounted board to other heat-dissipating components, and the like.

Although not shown in FIG. 1, a plating layer may be present on the uppermost surface of the heat-dissipating plate 1. Due to this, for example, it is possible to further improve the bonding property with the electronic element 11 (specifically, soldering with the electronic elements 11 is easier). It is possible for the plating layer to be, for example, Ni plating. It is possible to set the thickness of the plating layer to approximately 10 μm per layer and approximately 20 μm for the top and bottom combined.

[Properties and the Like of Electronic Element 11]

It is possible for the electronic element 11 to be, for example, a power semiconductor element. Although a large amount of heat may be released from the electronic element 11, which is a power semiconductor element, the heat may be efficiently exhausted by appropriately bonding the element-mounted board of the present embodiment to other heat-dissipating members (heat-dissipating fins or the like).

As described above, the electronic element 11 includes at least the ceramic plate 12. In addition, the electronic element 11 typically includes a metal layer 13.

The material of the ceramic plate 12 is not particularly limited as long as it is a ceramic material.

For example, it is possible for the material to be a nitride ceramic such as silicon nitride and aluminum nitride, an oxide ceramic such as aluminum oxide and zirconium oxide, a carbide ceramic such as silicon carbide, a boride ceramic such as lanthanum boride, and the like. Among the above, aluminum nitride, silicon nitride, and aluminum oxide are preferable from the viewpoint of insulation properties, strength of the bonding property to the metal layer 13, mechanical strength, and the like.

The metal layer 13 is preferably formed of copper, copper alloys, aluminum, and aluminum alloys from the viewpoint of electrical conductivity, thermal conductivity, and the like. For example, it is possible for the metal layer 13 to be formed of pure copper (C1020 or C1011 material), an oxygen-free copper sheet, and the like. A part of the metal layer 13 may be removed by etching or the like to form a circuit pattern.

It is possible to obtain the three-layer structure of the electronic element 11, which is metal layer 13—ceramic plate 12—metal layer 13, for example, by bonding the ceramic plate and the metal plates with a suitable brazing material.

As a brazing material, an Ag—Cu-based brazing material is preferable. That is, the brazing material is preferably a mixture of Ag powder, Cu powder, or the like. From the viewpoint of moderating the melting temperature and the like, when the total of the Ag powder and Cu powder is 100 parts by mass, the Ag powder is preferably 75 parts by mass or more and 98 parts by mass or less and the Cu powder is preferably 2 parts by mass or more and 25 parts by mass or less.

The brazing material may include Sn or In for the purpose of improving wettability with the ceramic plate or the like.

The blending amount of these components is preferably 0.4 parts by mass or more and 3.5 parts by mass or less.

The brazing material preferably includes active metals from the viewpoint of increasing reactivity with the ceramic plate and the like. Examples of active metals include titanium, zirconium, hafnium, niobium, and the like. It is preferable to include titanium from the viewpoint of enabling high reactivity with aluminum nitride substrates and silicon nitride substrates and an extremely high bonding strength.

The added amount of the active metal is preferably 1.5 parts by mass or more and 5.0 parts by mass or less with respect to a total of 100 parts by mass of Ag powder, Cu powder, Sn powder, or In powder. By appropriately adjusting the added amount of the active metal, it is possible to further suppress the generation of bonding defects.

It is possible to obtain a brazing material by mixing the metal powder as described above with an organic solvent or binder as necessary. For the mixing, it is possible to use a mortar machine, a revolving or orbital mixer, a planetary mixer, three rolls, and the like. Due to this, it is possible to obtain, for example, a paste-like brazing material.

The organic solvents able to be used here are not particularly limited. Examples thereof include methyl cellusolve, ethyl cellusolve, isophorone, toluene, ethyl acetate, terpineol, diethylene glycol monobutyl ether, texanol, and the like.

The binders able to be used here are not particularly limited. Examples thereof include polymer compounds such as polyisobutyl methacrylate, ethyl cellulose, methyl cellulose, acrylic resins, and methacrylic resins.

It is possible to obtain the electronic element 11, for example, as follows.

(1) A brazing material paste is coated on both surfaces of a ceramic plate and a copper plate is brought into contact with the coated surface.

(2) The ceramic plate and copper plate are bonded by a heat treatment in a vacuum or in an inert atmosphere.

The method for coating the brazing material paste on the ceramic plate in (1) described above is not particularly limited. Examples thereof include a roll coater method, a screen-printing method, a transfer method, and the like. The screen-printing method is preferable in terms of easy uniform coating.

For the bonding of the ceramic plate to the copper plate in (2) described above, it is preferable to carry out the process in a vacuum or in an inert atmosphere such as nitrogen or argon, for example, at a temperature of 770° C. or higher and 830° C. or lower for a time of 10 minutes or more to 60 minutes.

[Relationship Between Heat-Dissipating Plate 1—Electronic Element 11 and Design of Element-Mounted Board as a Whole]

As described above, the design concept of the element-mounted board of the present embodiment is to improve the heat dissipation property by integrally forming the heat-dissipating plate 1 and the electronic element 11, instead of just the heat-dissipating plate 1 alone.

In this point, for example, when the thermal expansion coefficient of the heat-dissipating plate 1 at a temperature of 25° C. to 400° C. is $a_1$ and the thermal expansion coefficient of the ceramic plate 12 at a temperature of 25° C. to 400° C. is $a_2$, the difference between $a_1$ and $a_2$ is 5.0 ppm K$^{-1}$ or less.

In addition, as another viewpoint, when the element-mounted board is viewed from the top surface with the side of the main surface 3A of the heat-dissipating plate 1 as the top surface, the electronic element 11 preferably covers 10% to 80% of the area of the heat-dissipating plate 1 and more preferably 15% to 70%.

In a case where the electronic elements 11 with the approximate area ratio described above are mounted on the main surface 3A, the flatness of the main surface 3B is set to 50 μm to 600 μm, or the values of $h_1/a$, $h_2/b$, and the like are appropriately designed such that it is possible to obtain a favorable heat dissipation property while reducing the generation of unintended distortion, thermal stress, and the like to a good level.

[Solder]

The type of the solder 14 is not particularly limited and, for example, it is possible to use lead-tin eutectic solder or lead-free solder. It is possible to set the thickness of the solder coating to be 0.1 mm to 0.2 mm, for example. In addition, the ref low conditions are not particularly limited and may be appropriately set according to the melting temperature or the like of the solder 14; however, typically, it is possible to set the conditions to 250° C. to 350° C. for approximately 5 minutes to 30 minutes. By ensuring that the temperature is not excessively high/time is not excessively long, it is possible to suppress unintended changes in flatness, and the like.

[Method for Manufacturing Element-Mounted Board]

It is possible to manufacture the element-mounted board of the present embodiment, for example, as follows.

(1) Preparation of a heat-dissipating plate: A heat-dissipating plate is prepared in which aluminum or magnesium-containing metal layers are formed on the front and back surfaces of a flat plate-shaped metal-silicon carbide complex including aluminum or magnesium.

(2) Adjustment of flatness: The flatness of at least one surface of the heat-dissipating plate prepared in (1) is adjusted. Preferably, on at least one surface of the prepared heat-dissipating plate, a convex curvature is provided in the direction of the opposite side to that of the one surface.

(3) Bonding: The heat-dissipating plate for which the flatness was adjusted in (2) described above is bonded to a separately prepared electronic element using solder or the like.

A more detailed description will be given of the procedure described above.

(1) Preparation of Heat-Dissipating Plate:

For example, it is possible to obtain a heat-dissipating plate on which metal layers are provided on both the front and back surfaces of a flat plate-shaped metal-silicon carbide complex by (i) a step of forming a silicon carbide powder into a flat plate-shape to carry out sintering and obtain a flat plate-shaped molded body (preform) and (ii) a step of impregnating the molded body (preform) with a metal.

In the step of (i) described above, first, the raw silicon carbide powder (preferably one or two or more silicon carbide particles with an average particle diameter of 1 μm to 300 μm) is made into a flat plate-shape by a suitable method.

As the method forming a flat plate-shape, it is possible to appropriately apply known methods. For example, it is possible to use a dry press method, a wet press method, an extrusion molding method, an injection method, a casting method, a method of punching out after sheet forming, and the like.

When the silicon carbide powder is formed into a flat plate-shape, inorganic or organic binders may be appropriately added to develop strength such that abnormalities such as cracking are not generated during the metal impregnation. Silica sol is preferable as a binder since it is easy to obtain high-strength molded bodies. The addition of a binder with a volume ratio of 20 or less with respect to 100 silicon carbide as solid content is preferable for the reason of improved relative density.

The flat plate obtained as described above is usually sintered after a drying, heating, and degreasing process, although this varies depending on the manufacturing conditions. Due to this, it is possible to obtain a molded body (also called a preform) having sufficient strength.

The sintering conditions are preferably a temperature of 700° C. or higher in an inert atmosphere or in air. However, in a case of sintering in air at a temperature of 1100° C. or higher, the silicon carbide may be oxidized and the thermal conductivity of the obtained complex may decrease. Thus, it is preferable to carry out the sintering at this temperature or lower.

The relative density of the preform obtained by sintering is preferably 55% to 75%. By setting the relative density of the preform to 55% to 75%, the thermal expansion coefficient of the heat-dissipating plate 1 is easily designed to be approximately 6 ppm/K to 10 ppm/K. The relative density is defined as the volume ratio of silicon carbide in the volume of the silicon carbide molded body (preform) having voids before impregnation with metal.

To achieve a relative density of 55% to 75% in the preform, silicon carbide powders of different particle sizes are preferably blended at the stage of obtaining the flat plate before sintering. In the case of silicon carbide, examples thereof include using a mixture of powder with an average grain size of 100 μm and powder with an average grain size of 10 μm or finer, or powder in which powder with an average grain size of 60 μm and powder with an average grain size of 10 μm or finer are mixed.

Here, it is possible to determine the average grain size by using a scanning electron microscope (for example, JSM-T200 manufactured by JEOL Ltd.) and an image analyzer (for example, manufactured by Nippon Avionics Co., Ltd.) to calculate the average value of the diameter determined for 1000 particles.

For the purpose of making the flatness of the main surface of the heat-dissipating plate preferable, a part of the preform may be machined before the obtained preform is impregnated with metal.

For example, at least one surface of the preform may be processed by a cutting and grinding tool such as a lathe so as to have a convex curved shape toward the outside of the preform. In a case where machining (a cutting process) is performed at the preform stage, it is not necessary to use special equipment or the like for metal cutting and there is an advantage in that the degree of curvature and flatness are easily controlled.

In step (ii) described above (metal impregnation), it is possible to adopt a so-called molten metal forging method or die-casting method to impregnate the preform obtained by sintering with metal.

In the case of the molten metal forging method, the preform is impregnated with a metal including aluminum or magnesium and it is possible to produce a metal-silicon carbide complex provided with a complex part including silicon carbide and metal and a surface metal layer on the outer surface of the complex part.

Examples of method for obtaining a metal-silicon carbide complex by impregnating the metal (alloy) including aluminum or magnesium into the preform include the following method.

One or more fibers, spherical particles, and crushed-form particles formed of alumina or silica are arranged in direct contact with both surfaces of the preform and interposed between release plates to form a single block.

The block is then preheated at 500° C. or higher and 650° C. or lower and then one or two or more are arranged in high-pressure containers. Thereafter, as soon as possible to prevent the temperature of the block from dropping, molten metal including aluminum or magnesium is pressed at a pressure of 30 MPa or higher to impregnate the metal into the voids of the preform.

Due to this, a metal-silicon carbide complex provided with a complex part including silicon carbide and metal and a surface metal layer on the outer surface of the complex part is obtained.

In the die-casting method, the preform is set in a mold having a cavity in the shape of the product, the mold is tightened, and then metal is injected therein at high speed to obtain the metal-silicon carbide complex.

Here, for example, in the molten metal forging method described above, it is possible to provide a metal layer on the surface of the metal-silicon carbide complex by devising the form of the concave mold and/or convex mold, more specifically, by devising the provision of a "gap", which corresponds to a metal layer, between the mold and the preform (that is, as shown in FIG. 1, it is possible to obtain the heat-dissipating plate 1 with the metal layer 3 formed on the front and back surfaces of the complex 2).

Here, in a case where the metal layer is formed in this manner, the composition of the metal impregnated in the complex and the composition of the metal forming the metal layer are basically the same.

The metal to be impregnated is not particularly limited as long as it includes aluminum or magnesium. A metal with aluminum or magnesium as the main component is preferable and a metal with aluminum as the main component is more preferable.

The metal to be impregnated may include other elements other than aluminum or magnesium.

For example, the metal to be impregnated may have aluminum as a main component and contain 0.1% by mass or more and 1.5% by mass or less of magnesium and 0.1% by mass or more and 18% by mass or less of silicon. The alloying of silicon and magnesium with aluminum has the advantage that the melting point of the alloy is decreased and the viscosity of the molten metal at high temperatures is decreased and it is easier to obtain a dense complex in high temperature casting or the like.

An annealing process may be performed for the purpose of removing distortions created during impregnation or the like. An annealing process for the purpose of removing distortions is preferably performed at a temperature of 400° C. or higher and 550° C. or lower for 10 minutes or more.

When the annealing temperature is 400° C. or higher, the distortion inside the heat-dissipating plate 1 is sufficiently eliminated, making it possible to suppress the curvature from changing significantly in the annealing process step after machining.

When the annealing temperature is 550° C. or lower, it is possible to prevent melting of the metal (for example, aluminum alloy) used in the impregnation.

When the annealing time is 10 minutes or more, the distortion inside the heat-dissipating plate 1 is sufficiently eliminated and it is possible to suppress the curvature from changing significantly during the annealing process step of removing the processing distortion after machining.

(2) Adjustment of Flatness:

As an example, it is possible to perform the flatness adjustment by heating and pressing the heat-dissipating plate 1 obtained as described above.

Figure 3:
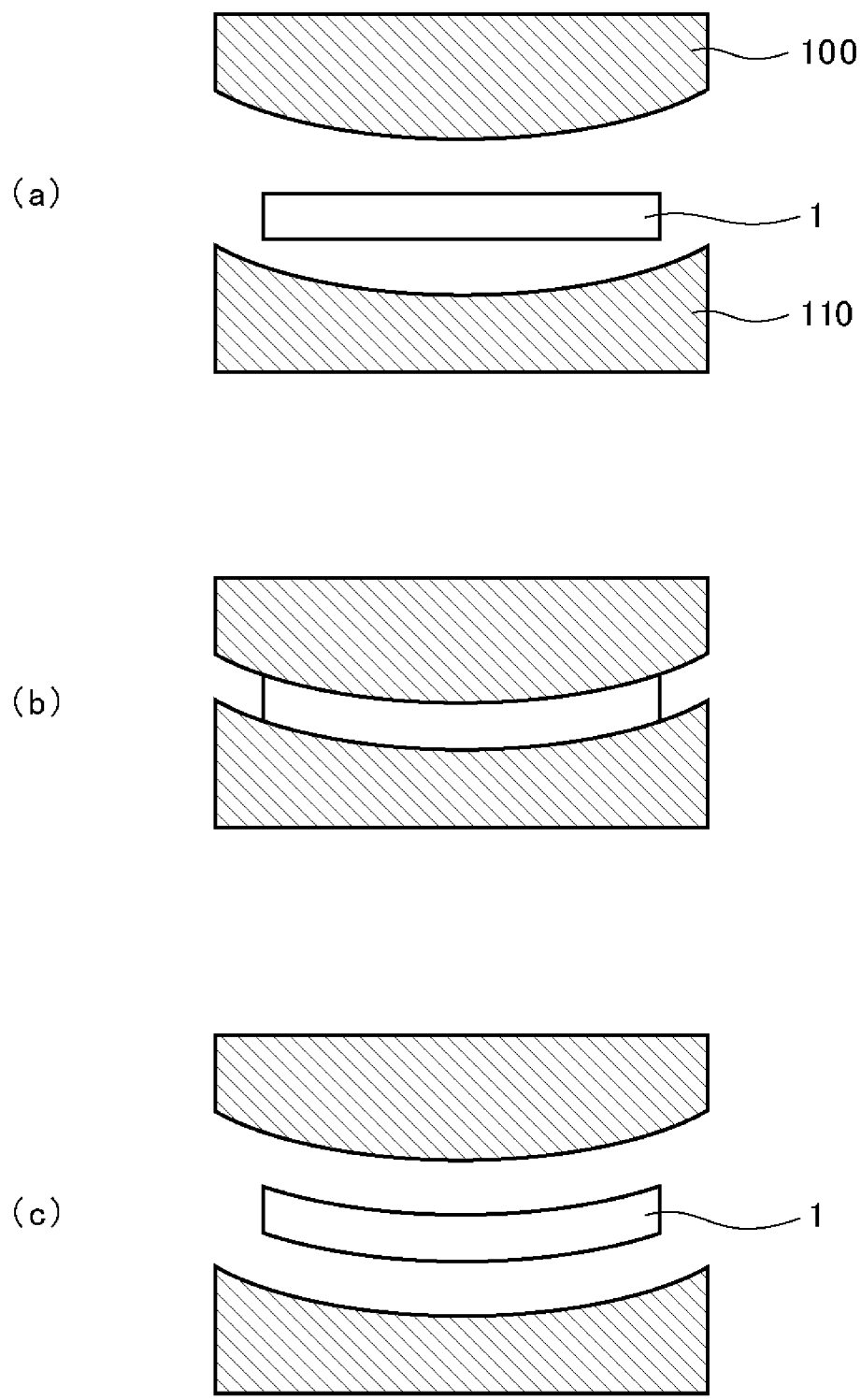
FIG. 3 is a diagram for illustrating "heating and pressing" in the manufacturing steps.

Specifically, as shown in FIG. 3(a), FIG. 3(b), and FIG. 3(c), the heat-dissipating plate 1 is interposed between a press convex die 100 and a press concave die 110 and heated and pressed (pressed while being heated). Due to this, it is possible to adjust the flatness of the main surface of the heat-dissipating plate 1.

The press convex die 100 and the press concave die 110 are shaped and processed such that a predetermined curvature is imparted to the heat-dissipating plate 1. In addition, typically, the form of the convex portion of the press convex die 100 and the form of the concave portion of the press concave die 110 are approximately the same. In other words, typically, in a case where the press convex die 100 and the press concave die 110 are overlaid without interposing the heat-dissipating plate 1 therebetween, it is almost impossible to have space between the press convex die 100 and the press concave die 110.

The material of the press convex die 100 and the press concave die 110 is not particularly limited other than being substantially non-deforming under the temperature and pressure conditions described below. Specifically, ceramics such as carbon and boron nitride and metal materials such as cemented carbide and stainless steel are preferably used.

The heating temperature during heating and pressing is not particularly limited as long as it is possible to obtain the heat-dissipating plate 1 imparted with appropriate curvature. However, from the viewpoint of productivity and reducing pressure, the heating temperature is preferably as high as possible in a range where the metal in the heat-dissipating plate 1 does not melt. In the present embodiment, given that the metal included in the heat-dissipating plate 1 is aluminum, magnesium, and the like (including cases of being an alloy), the temperature is preferably 450° C. or higher and 550° C. or lower.

The pressure during heating and pressing is not particularly limited as long as it is possible to obtain the heat-dissipating plate 1 imparted with an appropriate curvature. The pressure may be appropriately adjusted according to the thickness of the heat-dissipating plate 1, the heating temperature, and the like. However, from the viewpoints of productivity, reliably imparting curvature, and the like, the pressure is preferably 10 kPa or more and more preferably 30 kPa or more and 250 kPa or less.

As long as the heat-dissipating plate 1 imparted with an appropriate curvature is obtained, the time of the heating and pressing is also not particularly limited. However, from the viewpoints of reliably imparting curvature and the like, for example, the time during which the temperature of the heat-dissipating plate 1 itself is 450° C. or more is preferably 30 seconds or more and more preferably 30 seconds or more and 300 seconds or less.

On the other hand, as another example, the flatness adjustment may be performed by machining (grinding, cutting, or the like) at least one surface (the surface which is the main surface 3B when made into an element-mounted board) of the heat-dissipating plate 1 obtained as described above. Specifically, it is possible to adjust the flatness of at least one of the main surfaces (main surface 3B) of the heat-dissipating plate 1 by using a tool capable of precision machining (grinding, cutting, and the like) such as a lathe.

Since the warpage changes before/after the electronic element 11 is mounted on the heat-dissipating plate 1, it is preferable to adjust the flatness in advance in anticipation of such changes.

For example, under conditions in which six 50 mm×58 mm electronic elements 11 (ceramic substrate) are mounted on the 187.5 mm×137.5 mm heat-dissipating plate 1 (coverage area of 174 cm²/257 cm², coverage ratio of 67.5%), before and after mounting, the warpage decreases by approximately 150 μm in the long side direction and approximately 6 μm in the short side direction.

When adjusting the flatness, both heating and pressing and machining may be performed.

The steps for manufacturing the heat-dissipating plate may include other steps not described above.

As an example, the steps for manufacturing the heat-dissipating plate may include a step of providing holes for screw fastening. Specifically, it is possible to provide holes for screw fastening for bonding with other heat-dissipating components by machining or the like.

The step of providing holes for screw fastening may be performed at any stage, but it is particularly preferably performed before machining in a case where machining is carried out when adjusting the flatness of the heat-dissipating plate. In this manner, it is also possible to use the provided holes for fixing to a lathe or the like.

As another example, the steps for manufacturing the heat-dissipating plate may include a step of polishing one surface or both surfaces of the heat-dissipating plate as appropriate. Due to this, for example, it is possible to adjust the arithmetic mean roughness Ra of the surface of the heat-dissipating plate.

As yet another example, the steps for manufacturing the heat-dissipating plate may include a step of providing a plating layer on the uppermost surface of the heat-dissipating plate. The significance and the like of providing a plating layer is as described above.

(3) Bonding:

For example, it is possible to obtain an element-mounted board by (i) first, coating solder paste in paste form by adding flux to the surface of the heat-dissipating plate, for which the flatness or the like was adjusted as described above, (ii) installing an electronic element (for example, a ceramic circuit substrate) on the coated solder paste, and (iii) then melting the solder by reflowing.

This bonding typically causes some change in the flatness of one surface of the heat-dissipating plate (the main surface 3B in FIG. 1) and the flatness becomes 50 μm to 600 μm.

As described above, it is easier to obtain a preferable flatness in the final element-mounted board by, for example, adjusting the flatness of the main surface of the heat-dissipating plate before bonding, the type and thickness of the solder used, the area occupied by the electronic elements when the heat-dissipating plate is viewed from the top surface, and the like.

The constituent components, materials, manufacturing method, and the like of the electronic element (ceramic circuit substrate) are as described above. Thus, explanation thereof will not be repeated.

Preferably usable solders are as described above. Thus, explanation thereof will not be repeated.

The conditions for the reflowing described above are not particularly limited and may be set appropriately according to the melting temperature or the like of the solder and, typically, it is possible to set the temperature to be 250° C. to 350° C. for approximately 5 minutes to 30 minutes. By ensuring that the temperature is not excessively high and the time is not excessively long, it is possible to suppress unintended changes in flatness and the like.

A description was given above of the embodiments of the present invention; however, these are examples of the present invention and it is possible to adopt various configurations other than the above. The present invention is not limited to the embodiments described above and any modifications, improvements, and the like in a range in which it is possible to achieve the purpose of the present invention are included in the present invention.

Examples

A detailed description will be given of embodiments of the present invention based on Examples and Comparative Examples. The present invention is not limited to the Examples.

1. Manufacturing of Heat-Dissipating Plate
(Formation of Porous Silicon Carbide Body)

First, the below silicon carbide powder A, silicon carbide powder B, and silica sol were mixed in a stirring mixer for 30 minutes to obtain a mixture.

Silicon carbide powder A (NG-150, manufactured by Pacific Rundum Co., Ltd., average grain size: 100 μm) 300 g Silicon carbide powder B (GC-1000F, manufactured by Yakushima Denko Co., Ltd., average grain size: 10 μm) 150 g Silica sol (Snowtex, manufactured by Nissan Chemical Corporation) 30 g The obtained mixture was introduced into a mold and press-formed at a pressure of 10 MPa. Due to this, a flat plate-shaped molded body with dimensions of 185 mm×135 mm×5.5 mm was obtained. The obtained molded body was sintered at a temperature of 900° C. for 2 hours in air to obtain a porous silicon carbide body with a relative density (bulk density) of 65% by volume.

The surface of the porous silicon carbide body which is to be the main surface 2B of the finished heat-dissipating member was processed on a surface grinder. Thereafter, the surface which was to be the main surface 2A was then machined into a convex curved shape on a lathe with R=11 m. The thickness of the center of the porous silicon carbide body was adjusted so as to be 4.8 mm.

30 similar porous silicon carbide bodies were created for the following steps.

(Metal Impregnation)

Alumina fibers (manufactured by Tanaka Paper Industries Co., Ltd., 97% purity, sheet form) were placed on the main surface 2A side of the machined porous silicon carbide body and both surfaces were interposed between carbon coated stainless steel plates with dimensions of 210 mm×160 mm×0.8 mm to laminate 30 sheets.

Next, steel plates of 6 mm thickness were arranged on both sides, connected with six M10 bolts, and tightened with a torque wrench such that the tightening torque in the surface direction was 3 Nm to make a single block.

Thereafter, the integrated block was then preheated to 620° C. in an electric furnace and then squeezed in a preheated press die with an inner diameter of 400 mmφ. Molten metal of an aluminum alloy containing 12% by mass of silicon and 1.0% by mass of magnesium was poured into the press die and then pressed at a pressure of 100 MPa for 20 minutes. Due to this, the aluminum alloy was impregnated in the porous silicon carbide body.

After the impregnation was completed, the result was cooled to 25° C. and then cut along the shape of the release plate using a wet band saw and the interposed stainless-steel plate was peeled off. Furthermore, an annealing process was then performed at a temperature of 500° C. for 3 hours to remove distortion during impregnation.

Due to this, an aluminum-silicon carbide complex was obtained.

(Post-Impregnation Treatment)

The outer circumference of the obtained aluminum-silicon carbide complex was processed on an NC lathe to a size of 190 mm×140 mm in length and width. Thereafter, through holes with a diameter of 7 mm were processed at 8 locations around the outer edge portion and countersunk holes with a diameter of φ10-4 mm were processed at 4 locations.

In addition, the side corresponding to the main surface 2A of the aluminum-silicon carbide complex was machined such that R=11 m using a turning center. After machining, an annealing process was performed at a temperature of 500° C. for 4 hours using a muffle furnace. Due to this, the processing distortion was removed.

Furthermore, the aluminum-silicon carbide complex was cleaned by a blasting process with alumina abrasive grains under conditions of a pressure of 0.4 MPa and a transfer speed of 1.0 m/min and then electroless Ni—P and Ni—B plating was performed. Due to this, plating layers with a thickness of 8 μm (Ni—P: 6 μm, Ni—B: 2 μm) were formed on the complex surface.

Due to this, a heat-dissipating plate (heat-dissipating member) was obtained.

2. Preparation of Electronic Elements

The material of the ceramic plate, linear expansion coefficient, material of the copper layer, and overall size and thickness are as follows.

For example, it is possible for the material to be a nitride ceramic such as silicon nitride and aluminum nitride, an oxide ceramic such as aluminum oxide and zirconium oxide, a carbide ceramic such as silicon carbide, a boride ceramic such as lanthanum boride, and the like. Among the above, aluminum nitride, silicon nitride, and aluminum oxide are preferable from the viewpoint of insulation properties, bonding strength to the metal layer 13, mechanical strength, and the like.

Thermal expansion coefficient: Silicon nitride 3 ppm/K, aluminum nitride 4.6 ppm/K (room temperature 25° C. to 400° C.)

Copper material: Copper, copper alloy, aluminum, and aluminum alloy

Thickness of metal plate: 0.15 mm to 0.8 mm

Ceramic substrate size: 50 mm×58 mm

Ceramic substrate thickness: 0.32 mm to 1.00 mm

3. Soldering of Heat-Dissipating Plate and Electronic Elements

The solder composition, soldering conditions, thickness, and area covered by the substrate used for soldering the heat-dissipating plate and electronic element are as follows.

Solder composition: Lead/tin eutectic solder (63% tin)

Soldering temperature: 250° C.

Flux: Yes

Coating thickness: 0.2 mm

Area covered by substrate: Six 50 mm×58 mm ceramic substrates were mounted on a 187.5 mm×137.5 mm heat-dissipating plate. (Area covered: 174 cm$^2$/257 cm$^2$, coverage: 67.5%)

4. Measurement of Flatness (Measurement of f)

For the heat-dissipating plate 1 on which the electronic element 11 was mounted, the flatness of the main surface 3B on the side where the electronic element 11 was not mounted was measured using a VR-3000 apparatus manufactured by Keyence Corporation to obtain a flatness f. At that time, since the main surface 3B did not fit into the observation field of view of the apparatus, a range of 190 mm×100 mm was measured such that the center of the main surface 3B when viewed from the top surface (geometric center of gravity) and the center of the observation field of view of the measuring apparatus were aligned.

Table 1 shows the results of the measurements of nine of the heat-dissipating plates 1 of the Examples (Examples 1 to 9). The flatness f was 363.7 μm on average, with a maximum value of 480 μm, a minimum value of 246 μm, and a standard deviation of 77.3.

(Measurement of $h_1$ and $h_2$)

Data concerning the shape of the main surface 3B was acquired using a laser three-dimensional shape measuring machine and $h_1$ and $h_2$ were determined by analyzing the data. In addition, $h_1$ and $h_2$ were determined before and after mounting the electronic element 11 and the degree of change before and after mounting was confirmed.

Apparatus: Laser three-dimensional shape measuring machine (the following four apparatuses were integrated)

XYθ stage unit: K2-300 (manufactured by Kohzu Precision Co., Ltd.)

High-precision laser displacement meter: LK-G500 (manufactured by Keyence Corporation)

Motor controller: SC-200K (manufactured by Kohzu Precision Co., Ltd.)

AD converter: DL-100 (manufactured by Kohzu Precision Co., Ltd.)

Table 1 shows $(h_1/a)/(h_2/b)$ for nine of the heat-dissipating plates 1 as Examples (Examples 1 to 9). In Examples 1 to 9, $(h_1/a)/(h_2/b)$ was a minimum of 1.27 and a maximum of 1.78 and was included in the range of 1 or more and 1.9 or less as shown in the embodiment.

In addition, Table 2 shows the change in the warpage before and after mounting the electronic element 11 for the three of the heat-dissipating plates 1 as Examples (Examples 10 to 12). In these Examples, the warpage decreases by approximately 150 μm in the long side direction and approximately 6 μm in the short side direction. By adjusting the flatness in anticipation of these changes in advance, it is possible to realize the desired adhesion and heat dissipation property.

5. Measurement of Arithmetic Mean Roughness Ra (Surface Roughness Ra)

For the heat-dissipating plate 1 in Examples (129 sheets), the surface roughness Ra of the portion (the exposed portion of the main surface 3A) of the main surface 3A where the electronic element 11 is not mounted was measured with a measuring apparatus Surf test SJ-310 manufactured by Mitutoyo in accordance with ISO 4287-1997.

In the results of the measurement for the heat-dissipating plate 1 of Examples, the surface roughness Ra had an average of 1.02 μm, a maximum value of 1.52, a minimum value of 0.84, and a standard deviation of 0.11.

6. Performance Evaluation

The heat-dissipating plates 1 of Examples 1 to 9 shown in Table 1 were bonded to a heat-dissipating fin by screws and, when the adhesiveness, heat dissipation property, and the like between the heat-dissipating plates 1 and the heat-dissipating fins were evaluated, the adhesiveness and the heat dissipation property were favorable.

That is, it was shown that, by using the heat-dissipating plates 1 of Examples 1 to 9, it is possible to manufacture power modules with a favorable heat dissipation property, to improve the yield when manufacturing such power modules, and the like.

In the case where the flatness was 700 μm and the rest was the same as in Example 1 (Comparative Example), when fixed to a Cu plate or an Al plate by screw fastening, the heat-dissipating plate became M-shaped and gaps were created between the Cu plate and the Al plate. In addition, when manufacturing the power module after mounting the substrate, the case covering the upper portion did not fit.

TABLE 1

|  | f | $h_1$ | $h_1/a$ | $h_2$ | $h_2/b$ | $(h_1/a)/(h_2/b)$ |
|---|---|---|---|---|---|---|
| Example 1 | 286 | 172 | 0.000917 | 84 | 0.000611 | 1.502 |
| Example 2 | 294 | 165 | 0.000880 | 95 | 0.000691 | 1.274 |
| Example 3 | 246 | 144 | 0.000768 | 78 | 0.000567 | 1.354 |
| Example 4 | 326 | 202 | 0.001077 | 107 | 0.000778 | 1.384 |
| Example 5 | 480 | 217 | 0.001157 | 118 | 0.000858 | 1.349 |
| Example 6 | 417 | 210 | 0.001120 | 109 | 0.000793 | 1.413 |
| Example 7 | 403 | 257 | 0.001371 | 114 | 0.000829 | 1.653 |
| Example 8 | 415 | 285 | 0.001520 | 119 | 0.000865 | 1.756 |
| Example 9 | 397 | 275 | 0.001467 | 136 | 0.000989 | 1.483 | a 187.5 mm
b 137.5 mm

TABLE 2

|  | h1 | | | h2 | | |
|---|---|---|---|---|---|---|
|  | Before mounting (A) | After mounting (B) | A − B | Before mounting (A) | After mounting (B) | A − B |
| Example 10 | 336 | 182 | 154 | 134 | 72 | 62 |
| Example 11 | 310 | 162 | 148 | 129 | 72 | 57 |
| Example 12 | 321 | 172 | 149 | 147 | 88 | 59 |

This application claims priority based on Japanese Application No. 2020-063126 filed Mar. 31, 2020, the entire disclosure of which is incorporated herein.

REFERENCE SIGNS LIST

1 Heat-dissipating plate
2 Complex (metal-silicon carbide complex including aluminum or magnesium)
3 Metal layer (aluminum or magnesium-containing metal layer)
3A Main surface (surface on side on which electronic element 11 is mounted)
3B Main surface (other surface of main surface 3A)
5 Through hole
11 Electronic element
12 Ceramic plate
13 Metal layer
100 Press convex die
110 Press concave die

The invention claimed is:

1. An element-mounted board comprising:
a heat-dissipating plate in which aluminum or magnesium-containing metal layers are formed on both front and back surfaces of a flat plate-shaped metal-silicon carbide complex including aluminum or magnesium; and
an electronic element including a ceramic plate, which is mounted on a side corresponding to one of the front and back surfaces of the heat-dissipating plate, wherein
a flatness of another of the front and back surfaces of the heat-dissipating plate is 600 μm or less,
a thermal expansion coefficient of the heat-dissipating plate between room temperature and 400° C. is $a_1$,
a thermal expansion coefficient of the ceramic plate between room temperature and 400° C. is $a_2$, and
a difference between $a_1$ and $a_2$ is 5.0 ppm K$^{-1}$ or less.

2. The element-mounted board according to claim 1, wherein
the heat-dissipating plate is substantially rectangular,
a length of a long side of the rectangle is denoted by a and a length of a short side of the rectangle is denoted by b,
a straight line connecting each midpoint of two short sides of the other of the front and back surfaces is $l_1$ and a straight line connecting each midpoint of two long sides of the other of the front and back surfaces is $l_2$,
a maximum distance between a point on a curve formed by the other of the front and back surfaces and $l_1$ is $h_1$ when the heat-dissipating plate is viewed in a cross-sectional view which includes $l_1$ and which is substantially orthogonal to the other of the front and back surfaces,
a maximum distance between a point on a curve formed by the other of the front and back surfaces and $l_2$ is $h_2$ when the heat-dissipating plate is viewed in a cross-sectional view which includes $l_2$ and which is substantially orthogonal to the other surface, and
$h_1/a > h_2/b$.

3. The element-mounted board according to claim 2, wherein $(h_1/a)/(h_2/b)$ is 1.0 or more and 1.9 or less.

4. An element-mounted board comprising:
a heat-dissipating plate in which aluminum or magnesium-containing metal layers are formed on both front and back surfaces of a flat plate-shaped metal-silicon carbide complex including aluminum or magnesium; and
an electronic element including a ceramic plate, which is mounted on a side corresponding to one of the front and back surfaces of the heat-dissipating plate, wherein
a flatness of another of the front and back surfaces of the heat-dissipating plate is 600 μm or less, and
an arithmetic mean roughness Ra of a portion of one surface of the heat-dissipating plate on which the electronic element is not mounted is 0.2 μm to 2.0 μm.

5. The element-mounted board according to claim 1, wherein, when the element-mounted board is viewed from a top surface with the side corresponding to one of the front and back surfaces as the top surface, 10% to 80% of an area of the heat-dissipating plate is covered with the electronic element.

6. A method for manufacturing the element-mounted board according to claim 1, the method comprising:
a preparing step of preparing a heat-dissipating plate in which an aluminum or magnesium-containing metal layer is formed on both front and back surfaces of a flat plate-shaped metal-silicon carbide complex including aluminum or magnesium;

a flatness adjusting step of adjusting a flatness of at least one surface of the heat-dissipating plate; and a mounting step of mounting an electronic element including a ceramic plate on a surface on an opposite side to the one surface of the heat-dissipating plate.

* * * * *